(12) United States Patent
Thurk et al.

(10) Patent No.: US 7,279,832 B2
(45) Date of Patent: Oct. 9, 2007

(54) PHOSPHOR MATERIALS AND ILLUMINATION DEVICES MADE THEREFROM

(75) Inventors: Paul Thurk, Austin, TX (US); David Jursberg, Austin, TX (US)

(73) Assignee: Innovalight, Inc., Santa Clara, CA (US)

( * ) Notice: Subject to any disclaimer, the term of this patent is extended or adjusted under 35 U.S.C. 154(b) by 184 days.

(21) Appl. No.: 10/814,295

(22) Filed: Apr. 1, 2004

(65) Prior Publication Data

US 2004/0245912 A1    Dec. 9, 2004

Related U.S. Application Data

(60) Provisional application No. 60/458,941, filed on Apr. 1, 2003.

(51) Int. Cl.
   *H01J 1/62* (2006.01)

(52) U.S. Cl. .................. 313/503; 312/502; 312/504

(58) Field of Classification Search ......... 313/502–504
   See application file for complete search history.

(56) References Cited

U.S. PATENT DOCUMENTS

| | | |
|---|---|---|
| 3,842,306 A | 10/1974 | Henderson et al. |
| 4,047,069 A | 9/1977 | Akutsu et al. |
| 4,330,691 A | 5/1982 | Gordon |
| 4,642,951 A | 2/1987 | Mortimer |
| 4,890,033 A | 12/1989 | Ichinomiya |
| 4,923,032 A | 5/1990 | Nuernberger |
| 4,965,485 A | 10/1990 | Tarumi et al. |
| 5,073,805 A | 12/1991 | Nomura et al. |
| 5,142,343 A | 8/1992 | Hosokawa et al. |
| 5,293,050 A | 3/1994 | Chapple-Sokol et al. |
| 5,354,707 A | 10/1994 | Chapple-Sokol et al. |
| 5,422,489 A | 6/1995 | Bhargava |
| 5,438,234 A | 8/1995 | Fujino |
| 5,516,577 A | 5/1996 | Matsuura et al. |
| 5,536,949 A | 7/1996 | Hosokawa et al. |
| 5,537,000 A | 7/1996 | Alivisatos et al. |
| 5,552,665 A | 9/1996 | Trushell |
| 5,813,753 A | 9/1998 | Vriens et al. |
| 5,850,064 A | 12/1998 | Goldstein |
| 5,852,346 A | 12/1998 | Komoda et al. |

(Continued)

FOREIGN PATENT DOCUMENTS

EP    1111966 A2    6/2001

OTHER PUBLICATIONS

Madou, "Pattern Transfer with Additive Techniques," Fundamentals of Microfabrication, Second Edition, 2002, pp. 123-181, CRC Press, United States, no month.

(Continued)

*Primary Examiner*—Joseph Williams
*Assistant Examiner*—Bumsuk Won
(74) *Attorney, Agent, or Firm*—Foley & Lardner LLP

(57) ABSTRACT

This invention provides a phosphor material capable of absorbing primary light and converting that light into white light having a high color rendering index and illumination devices made from the phosphor material. The white light may have a color rendering index of 100 and may be produced with an efficiency of at least 30 lm/w. In one embodiment, the illumination device includes a secondary light source made from a plurality of Group IV semiconductor nanoparticles.

33 Claims, 7 Drawing Sheets

U.S. PATENT DOCUMENTS

| | | | |
|---|---|---|---|
| 5,882,779 A | 3/1999 | Lawandy | |
| 5,959,316 A | 9/1999 | Lowery | |
| 5,962,863 A | 10/1999 | Russell et al. | |
| 5,977,565 A | 11/1999 | Ishikawa et al. | |
| 5,990,479 A | 11/1999 | Weiss et al. | |
| 6,068,907 A | 5/2000 | Beauregard | |
| 6,069,440 A | 5/2000 | Shimizu et al. | |
| 6,117,514 A | 9/2000 | Herrmann | |
| 6,157,047 A | 12/2000 | Fujita et al. | |
| 6,175,187 B1 | 1/2001 | Tsutsui | |
| 6,207,229 B1 | 3/2001 | Bawendi et al. | |
| 6,215,881 B1 | 4/2001 | Azima et al. | |
| 6,245,259 B1 | 6/2001 | Höhn et al. | |
| 6,251,303 B1 | 6/2001 | Bawendi et al. | |
| 6,252,254 B1 | 6/2001 | Soules et al. | |
| 6,252,915 B1 | 6/2001 | Mollenkopf et al. | |
| 6,268,041 B1 | 7/2001 | Goldstein | |
| 6,322,901 B1 | 11/2001 | Bawendi et al. | |
| 6,336,837 B1 | 1/2002 | Maeda | |
| 6,389,771 B1 | 5/2002 | Moller | |
| 6,397,531 B1 | 6/2002 | Martin | |
| 6,406,803 B1 | 6/2002 | Abe et al. | |
| 6,417,019 B1 | 7/2002 | Mueller et al. | |
| 6,423,551 B1 | 7/2002 | Weiss et al. | |
| 6,441,551 B1 | 8/2002 | Abe et al. | |
| 6,501,091 B1 | 12/2002 | Bawendi et al. | |
| 6,501,102 B2 | 12/2002 | Mueller-Mach et al. | |
| 6,504,179 B1 | 1/2003 | Ellens et al. | |
| 6,508,573 B1 | 1/2003 | Yamazaki | |
| 6,515,314 B1 | 2/2003 | Duggal et al. | |
| 6,521,915 B2 | 2/2003 | Odaki et al. | |
| 6,522,065 B1 | 2/2003 | Srivastava et al. | |
| 6,544,870 B2 | 4/2003 | Park et al. | |
| 6,566,808 B1 | 5/2003 | Duggal et al. | |
| 6,585,947 B1 | 7/2003 | Nayfeh et al. | |
| 6,602,731 B2 | 8/2003 | Andriessen | |
| 6,608,330 B1 | 8/2003 | Yamada | |
| 6,632,694 B2 | 10/2003 | Torvik | |
| 6,649,138 B2 | 11/2003 | Adams et al. | |
| 6,660,410 B2 | 12/2003 | Hosokawa | |
| 6,661,029 B1 | 12/2003 | Duggal | |
| 6,669,158 B2 | 12/2003 | Masas | |
| 6,692,512 B2 | 2/2004 | Jang | |
| 6,692,986 B1 | 2/2004 | Bayer et al. | |
| 6,698,543 B2 | 3/2004 | Golterman | |
| 6,700,322 B1 | 3/2004 | Duggal et al. | |
| 6,701,686 B1 | 3/2004 | Platt | |
| 2001/0000622 A1 | 5/2001 | Reeh et al. | |
| 2001/0040232 A1 | 11/2001 | Bawendi et al. | |
| 2002/0004251 A1* | 1/2002 | Roberts et al. | 438/26 |
| 2002/0018632 A1 | 2/2002 | Pelka | |
| 2002/0152704 A1 | 10/2002 | Thompson et al. | |
| 2002/0153830 A1 | 10/2002 | Andriessen | |
| 2002/0167024 A1 | 11/2002 | Jabbour et al. | |
| 2003/0003300 A1 | 1/2003 | Korgel et al. | |
| 2003/0003614 A1 | 1/2003 | Andriessen | |
| 2003/0034486 A1 | 2/2003 | Korgel | |
| 2003/0042850 A1 | 3/2003 | Bertram et al. | |
| 2003/0047816 A1 | 3/2003 | Dutta | |
| 2003/0057821 A1* | 3/2003 | Fink et al. | 313/461 |
| 2003/0066998 A1 | 4/2003 | Lee | |
| 2003/0067265 A1* | 4/2003 | Srivastava et al. | 313/503 |
| 2003/0173541 A1 | 9/2003 | Peng et al. | |
| 2003/0186023 A1* | 10/2003 | Isoda et al. | 428/98 |
| 2003/0222572 A1 | 12/2003 | Su et al. | |
| 2003/0227249 A1 | 12/2003 | Mueller et al. | |
| 2004/0007169 A1 | 1/2004 | Ohtsu et al. | |
| 2004/0018382 A1* | 1/2004 | Kinlen | 428/690 |
| 2004/0023010 A1* | 2/2004 | Bulovic et al. | 428/209 |
| 2004/0027062 A1* | 2/2004 | Shiang et al. | 313/506 |
| 2004/0033345 A1 | 2/2004 | Dubertret et al. | |
| 2004/0036130 A1* | 2/2004 | Lee et al. | 257/409 |
| 2004/0105980 A1* | 6/2004 | Sudarshan et al. | 428/404 |
| 2004/0109666 A1* | 6/2004 | Kim II | 385/147 |
| 2004/0124352 A1* | 7/2004 | Kashima et al. | 250/288 |
| 2004/0145307 A1* | 7/2004 | Odaki | 313/512 |
| 2005/0266697 A1* | 12/2005 | Korgel et al. | 438/758 |

OTHER PUBLICATIONS

Zukauskas, et al., "Introduction to Solid-State Lighting," 2002, Chapter 2, pp. 7-19, John Wiley & Sons, Inc., New York, no month.

Heinrich, et al., "Luminescent Collodial Silicon Suspensions from Porous Silicon," Jan. 3, 1992, Science, pp. 66-68, vol. 255.

Belomoin, et al., "Oxide and Hydrogen Capped Ultrasmall Blue Luminescent Si Nanoparticles," Applied Physics Letters, Aug. 7, 2000, pp. 779-781, vol. 77, No. 6.

Belomoin, et al., "Observation of a Magic Discrete Family of Ultrabright Si Nanoparticles," Applied Physics Letters, Feb. 4, 2002, pp. 841-843, vol. 80, No. 5.

Dabbousi, et al., "(CdSe)ZnS Core-Shell Quantum Dots: Synthesis and Characterization of a Size Series of Highly Luminescent Nanocrystallites," J. Phys. Chem. B, 1997, pp. 9463-9475, vol. 101, No. 46,no month.

Bauer, et al., "Laser Synthesis of Low-Agglomerated Submicrometer Silicon Nitride Powders from Cholorinated Silanes," Journal of the American Ceramic Society, Nov. 1991, pp. 2759-2768, vol. 74, No. 11.

Holmes, et al., "Highly Luminescent Silicon Nanocrystals with Discrete Optical Transitions," J. Am. Chem. Soc., 2001, pp. 3743-3748, vol. 123, No. 16, no month.

English, et al., "Size Tunable Visible Luminescence from Individual Organic Monolayer Stabilized Silicon Nanocrystal Quantum Dots," Nano Letters, 2002, pp. 681-685, vol. 2, No. 7, no month.

Buriak, "Organometallic Chemistry on Silicon and Germanium Surfaces," Chemical Reviews, May 2002, pp. 1272-1308, vol. 102, No. 5.

Huisken, et al., "Light-Emitting Silicon Nanocrystals from Laser Pyrolsis," Advanced Materials, 2002, pp. 1861-1865, vol. 14, No. 24. no month.

Gorla, et al., "Silicon and Germanium Nanoparticle Formation in an Inductively Coupled Plasma Reactor," Journal of Vacuum Science & Technology Association, May/Jun. 1997, pp. 860-864, vol. 15, No. 3, Part I.

Holmes, et al., "Control of Thickness and Orientation of Solution-Grown Silicon Nanowires," Science, Feb. 25, 2000, pp. 1471-1473, vol. 287.

Hanrath, et al., "Nucleation and Growth of Germanium Nanowires Seeded by Organic Monolayer-Coated Gold Nanocrystals," J. Am. Chem. Soc., 2002, pp. 1424-1429, vol. 124, No. 7, no month.

Ding, et al., "Electrochemistry and Electrogenerated Chemiluminescence from Silicon Nanocrystal Quantum Dots," Science, May 17, 2002, pp. 1293-1297, vol. 296.

Lu, et al., "Growth of Single Crystal Silicon Nanowires in Supercritical Solution from Tethered Gold Particles on a Silicon Substrate," Nano Letters, 2003, pp. 93-99, vol. 3, No. 1, no month.

Bauer, et al., "Laser Synthesis of Low-Agglomerated Submicrometer Silicon Nitride Powders from Cholorinated Silanes," *J Am. Ceram. Soc.*, 74(11), pp. 2759-2768, 1991. Published by American Ceramic Society, Westerville, OH.

Heinrich, et al., "Luminescent collodial silicon suspensions from porous silicon," *Science*, vol. 255, pp. 66-68, 1992. Published by American Association for the Advancement of Science, Washington, D.C.

Seraphin, et al., "Influence of nanostructure size on the luminescence behavior of silicon nanoparticle thin films," *J. Mater. Res.*, vol. 12, No. 12, pp. 3386-3392, 1997. Published by Materials Research Society.

Dabbousi, et al., "(CdSe)ZnS core-shell quantum dots: synthesis and characterization of a size series of highly luminescent nanocrystallites," *J. Phys. Chem. B*, vol. 101(46), pp. 9463-9475, 1997. Published by American Chemical Society.

Allongue. "Porous silicon formation mechanisms," Properties of Porous Silicon, Leigh Canham Ed., ISBN 0852969325, pp. 3-29, 1997. Published by INSPEC.

Gorlia, et al., "Silicon and germanuim nanoparticle formation in an inductively coupled plasma reactor," *J Vac. Sci. Technol. A.*, vol. 15(3), pp. 860-864, 1997. Published by American Institute of Physics.

Jabbour, et al., "Highly efficient and bright organic electroluminescent devices with an aluminum cathode," *Applied Physics Letters*, vol. 71(13), pp. 1762-1764, 1997. Published by American Institute of Physics.

Credo, et al., "External quantum efficiency of single porous silicon nanoparticles," *Applied Physics Letters*, vol. 74, No. 14, pp. 1978-1980, 1999. Published by American Institute of Physics.

Holmes, et al., Control of thickness and orientation of solution-grown silicon nanowires, *Science*, 287, pp. 1471-1473, 2000.

Belomoin et al., "Oxide and hydrogen capped ultrsmall blue luminescent Si nanoparticles," *Appl. Phys. Lett.*, vol. 77(6), pp. 779-781, 2000. Published by American Institute of Physics.

Holmes, et al., "Highly luminescent silicon nanocrystals with discrete optical transitions," *J. Am. Chem. Soc.*, vol. 123, pp. 3743-3748, 2001. Published by American Chemical Society.

Ledoux, et al., "Effect of passivation and aging on the photoluminescence of silicon nanocrystals," *Applied Physics Letters*, vol. 79, No. 24, pp. 4028-4030, 2001. Published by American Institute of Physics.

Kang, et al., "Enhancing the electroluminescent properties of organic light-emitting devices using a thin NaCl layer," *Applied Physics Letters*, vol. 81, No. 14, pp. 2581-2583, 2002. Published by American Institute of Physics.

Pell, et al., Single particle and ensemble spectroscopy of silicon nanoparticles, *Mat. Res. Symp. Proc.*, vol. 704, pp. 17-21, 2002. Published by Materials Research Society.

Belomoin et al., "Observation of a magic discrete family of ultrabright Si nanoparticles," *Appl. Phys. Lett.*, vol. 80 (5), pp. 841-843, 2002. Published by American Institute of Physics.

English, et al., "Size tunable visible luminescence from individual organic monolayer stabilized silicon nanocrystal quantum dots," *Nano Letters*, 2, pp. 681-685, 2002. Published by American Chemical Society, Washington, D.C.

Hanrath, et al., "Nucleation and growth of germanium nanowires seeded by organic monolayer-coated gold nanocrystals," *J. Am. Chem. Soc.*, vol. 124, No. 7, pp. 1424-1429, 2002. Published by American Chemical Society.

"Organic light emitting diodes (OLEDs) for general illumination Update 2002." An Optoelectronics Industry Development Association (OIDA) Technology Roadmap, Published by Optoelectronics Industry Development Association.

Huisken, et al., "Light-emitting silicon nanocrystals from lasers pyrolysis," *Adv. Mater.*, vol. 14(24), pp. 1861-1865, 2002. Published by VCH Publishers, Deerfield Beach, FL.

Madou. "Pattern transfer with additive techniques" *Fundamentals of Microfabrication, The Science of Miniaturization*, 2$^{nd}$ Ed., Chapter 3., 2002. Published by CRC Press, Boca Raton, FL.

Buriak. "Other suitable passivating agents and their production," *Chemical Reviews*, vol. 102(5), pp. 1271-1308, 2002. Published by American Chemical Society.

Zukauskas, et al., "Introduction to solid-state lighting," *Vision, Photometry and Colorimetry*, Ch. 2, pp. 7-19, 2002. Published by John Wiley & Sons, New York.

Lu, et al., Growth of single crystal silicon nanowires in supercritical solution from tethered gold particles on a silicon substrate, Nanoletters, 2003, vol. 3, No. 1, pp. 93-99, 2003. Published by American Chemical Society.

Durel 3 Lamp Technology, www.rogerscorporation.com, website article.

* cited by examiner (a) RGB LED
(b) UV LED with RGB Phosphors
(c) Blue LED with Yellow Phosphor

PHOSPHOR MATERIALS AND ILLUMINATION DEVICES MADE THEREFROM

CROSS-REFERENCES TO RELATED APPLICATIONS

This application claims priority from application of U.S. provisional patent application Ser. No. 60/458,941, filed Apr. 1, 2003, the entire disclosure of which is incorporated herein by reference and for all purposes.

FIELD OF THE INVENTION

This invention relates to phosphor materials capable of providing a white light with a very high color rendering index and illumination devices made from the phosphor materials.

BACKGROUND OF THE INVENTION

In the U.S., about one-quarter of the nation's electricity budget is spent on lighting, or more than $37 billion annually. Most of this expense results from the use of conventional incandescent and fluorescent lighting. Unfortunately, the efficiency of current incandescent and fluorescent lamps plateaued many years ago at 5% and 20%, respectively. Due to the large electricity cost associated with conventional incandescent and fluorescent light sources, much attention has focused recently on more energy efficient lighting alternatives. One alternative is provided by Solid State Lighting (SSL). SSL is a lighting technology that uses light emitting diodes (LEDs) for white light general illumination. SSL has the potential to offer enormous economic and environmental advantages over conventional lighting technologies for general illumination, promising efficiencies in excess of 50%. In addition, SSL offers advantages in color tunability, design flexibility, robustness, long lifetimes, mercury-free manufacturing, and fast turn on times.

While there exist white light SSL solutions for general illumination, none are suitable for widespread use today. In fact, current roadmaps project SSL will not supplant current lighting alternatives in earnest until 2020, resulting in continuing energy wastage for almost two decades. Much of this is related to the current high cost of solid state lamps— currently two orders of magnitude more expensive than conventional lighting sources. However, there are some performance issues as well. The most common SSL technologies are based on bulk inorganic LEDs (light emitting semiconductor chips). There are two main categories. The first category includes phosphor based systems where phosphors are used to convert the output from an LED light source into visible light. The most common phosphor systems use a blue LED in combination with a yellow phosphor. In these systems the blue light from the LED excites the phosphor which emits yellow light. The yellow light mixes with the blue light from the LED to produce a whitish light. In another common phosphor based system, light from an ultraviolet (UV) LED is used to excite red, green, and blue phosphors to produce a whitish light. The second category of SSL devices is based on the use of multiple LEDs. In these systems at least two LEDs (e.g. blue and yellow) or three LEDs (e.g. red, blue, and green) are used in combination. When the LEDs emit, the light from the different LEDs mixes to create a whitish light. FIG. 1 shows schematic diagrams illustrating each of the SSL systems described above.

Unfortunately, SSL illumination devices of the type described above have met with limited commercial success because they produce white light with a poor color rendering index (CRI). CRI describes a light source's ability to accurately render the colors of the objects it illuminates. CRI has a universal measurement system numbering from 0 to 100, where the culturally accepted incandescent bulb sets the standard at 100. Generally, the higher the CRI the better the color rendering properties of the light. The CRI for presently available SSL devices is around 75 or lower. Another disadvantage of the SSL white light LEDs presently available is their relatively poor efficiency. White light LEDs are currently far from their promised efficiency, and the efficiencies that have been achieved by certain monolithic devices. In most cases, SSL devices operate in the 10-20 lumens/watt (lm/w) range which is too low to make these devices an attractive alternative to conventional lighting technologies—particularly on a cost-benefit basis. In addition the SSL white light LEDs presently available suffer from lifetime problems, color shifting over time, and differential aging of the different color LEDs and phosphors used to generate the white color. SSL devices based on the multiple LED approach further suffer from the drawback that they involve complex drive electronics to compensate for the differential aging and color shifting inherent in each of the different compounds used to make up the three types of LEDs.

The phosphors used in the SSL devices described above are materials capable of absorbing energy and reemitting the energy in the form of light, having a longer wavelength than the absorbed energy. This process is known as luminescence. A variety of phosphor materials are known. Most of these are made from inorganic materials, such as zinc sulfide or yttrium oxides that have been doped with transition or rare earth metals. U.S. Pat. No. 6,501,091 describes light emitting diodes made from quantum dots of Group II-VI semiconducting materials embedded in a matrix have been proposed as phosphors in SSL illumination devices. However, that patent does not disclose the use of Group IV nanoparticles in an illumination device. Nor does the patent disclose the production of white light having a high CRI value.

Thus a need exists for an efficient and inexpensive white light LED system that is capable of producing white light with a high CRI without substantial color shifting, lifetime, or differential aging problems.

SUMMARY OF THE INVENTION

One aspect of the present invention provides phosphor materials capable of providing a high quality secondary light when photopumped with a suitable primary light. In some embodiments the secondary light is white light with a high CRI. The invention further provides illumination devices made from the phosphor materials. In certain embodiments of the invention, the CRI of the white light is at least 90. This includes embodiments where the CRI of the white light is at least 95, further includes embodiments where the CRI of the white light is at least 98, and still further includes embodiments where the CRI of the white light is 100. This represents a substantial advance over other presently available white light phosphors.

In addition to providing high quality white light, the phosphor materials may have very high photoluminescence efficiencies. In some embodiments the photoluminescence efficiency of the phosphor materials is at least 50%. Illumination devices made from the phosphor materials may produce white light with great efficiency. In certain embodiments white light is produced with an efficiency of at least 20 lm/w.

The advance in white light photoluminescence which the phosphor materials provided herein represents is based, at least in part, on the inventors' discovery that white light having a high CRI value may be emitted from phosphor materials containing a collection of differently sized photoluminescent semiconductor nanoparticles. Because the photoluminescence spectrum for each particle is size-dependent, the collection of nanoparticles is capable of emitting light across the visible spectrum. In the construction of the phosphor materials, groupings of nanoparticles having specified sizes may be laid down in selected proportions and orientations in order to generate the desired color quality when multiplexed together.

Group IV nanoparticles, including silicon (Si) nanoparticles, germanium (Ge) nanoparticles, and SiGe alloy nanoparticles, are particularly well suited for use in the phosphor materials provided herein.

The primary light source which serves to photopump the phosphor material may be any light source capable of exciting the phosphor material and inducing the phosphor material to photoluminesce as described above. Typically, the photoluminescence will have a lower energy than the photopumping light. For example, the photopumping light may be ultraviolet (UV) radiation or blue light which is used to produce photoluminescence of lower energies in the visible spectrum. In other embodiments the photoluminescence will have a higher energy than the photopumping light. This results from a multi-photon process wherein a nanoparticle absorbs multiple photons from a primary light source and emits light having an energy that is additive of the energies of the two or more absorbed photons.

Examples of suitable primary light sources include, but are not limited to, LEDs, electroluminescent devices and solid-state lasers, including blue LEDs, UV LEDs, and red LEDS. Other suitable primary light sources include fluorescent, incandescent and halogen lamps.

BRIEF DESCRIPTION OF THE DRAWINGS

FIG. 1a represents an SSL illumination device based on multiple LEDs. FIG. 1b represents an SSL illumination device based on a UV LED and red, green, and blue phosphors. FIG. 1c represents an SSL device based on a blue LED and a yellow phosphor.

DETAILED DESCRIPTION OF THE PREFERRED EMBODIMENTS

Figure 1:
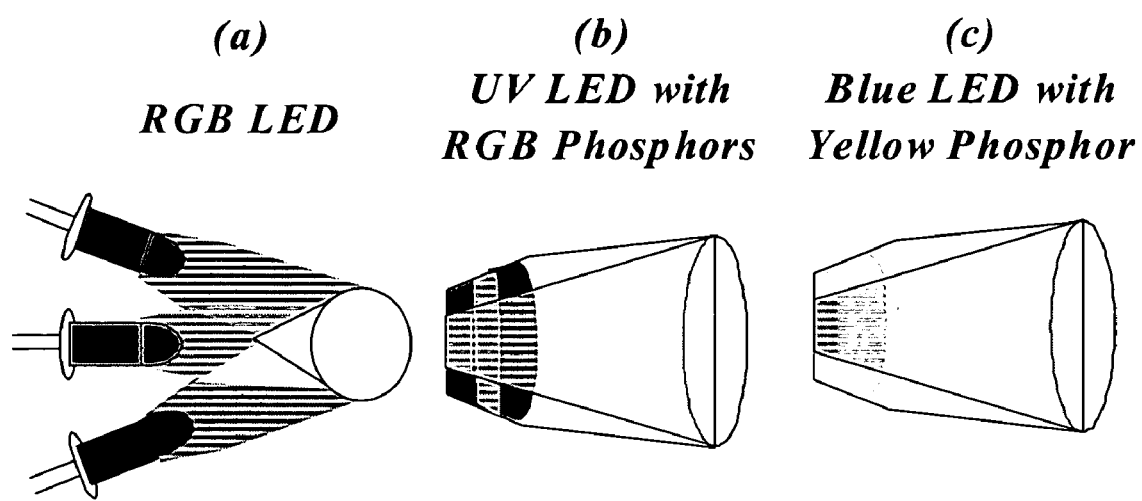
FIG. 1 shows schematic diagrams of three types of SSL illumination devices.

The invention provides phosphor materials and illumination devices made therefrom. The phosphor materials may be designed to produce substantially monochromatic light or polychromatic light, including white light. The white light so produced may be characterized by a CRI value that is substantially higher than the CRI value of the white light produced by other presently known SSL illumination devices. In certain embodiments of the invention, the CRI of the white light is at least 85. This includes embodiments where the CRI of the white light is at least 90, further includes embodiments where the CRI of the white light is at least 95, even further includes embodiments where the CRI of the white light is at least 98, and still further includes embodiments where the CRI of the white light is 100.

The phosphor materials may be incorporated into a broad variety of applications. Such applications include electroluminescent lighting devices as described in U.S. Patent Application Publication No. 2003/0003300 and ceiling tiles as described in U.S. Patent Application No. 60/458,942 entitled, "Light Emitting Ceiling Tile," to Paul Thurk, the entire disclosures of which are hereby incorporated by reference. Another such application is an illumination device. An illumination device made from the phosphor material may include a primary light source which photopumps the phosphor material which, in turn, emits a secondary light. The secondary light may itself be a white light, or the mixture of the secondary light with an unabsorbed portion of the primary light may be a white light.

The CRI is a measure of the distortion of the colors of a set of standard pigments when measured with a light source of interest as compared to a standard light source. A method for calculating the CRI for a light source may be found in *Introduction to Solid State Lighting*, Chapter 2, Wiley Interscience Press (2002), which is incorporated herein by reference.

The phosphor materials may photoluminesce with high efficiency. In some embodiments the phosphor materials have a photoluminescence efficiency of at least 50%. This includes embodiments where the phosphor materials have a photoluminescence efficiency of at least 60%, further includes phosphor materials having a photoluminescence efficiency of at least 70%, further includes phosphor materials having a photoluminescence efficiency of at least 80%, and further includes phosphor materials having a photoluminescence efficiency of at least 90%. Illumination devices made with the phosphor materials are capable of producing light with high efficiency, although the efficiency of the devices may be limited by the efficiency of the primary light source used to pump the photoluminescent material. In certain embodiments white light is produced with an efficiency of at least 20 lm/w. This includes embodiments where the efficiency of the emitted light is at least 30 lm/w, further includes embodiments where the efficiency is at least 40 lm/w, and still further includes embodiments where the efficiency of the emitted light is at least 45 lm/w.

Phosphor materials capable of emitting high CRI light may be made by employing a phosphor material made up of a collection of photoluminescent semiconductor nanoparticles having a polydisperse size distribution. As used herein, the term "nanoparticle" generally refers to particles that have an average diameter between about 1 nm to 100 nm and may, in some instances, include elongated particle shapes, such as nanowires, in addition to more spherical, triangular or square particles. Nanoparticles have an intermediate size between individual atoms and macroscopic bulk solids. Nanoparticles typically have a size on the order of the Bohr exciton radius (e.g. 4.9 nm for silicon), or the de Broglie wavelength, of the material, which allows individual nanoparticles to trap individual or discrete numbers of charge carriers, either electrons or holes, or excitons, within the particle. The spatial confinement of electrons (or holes) by nanoparticles is believed to alter the physical, optical, electronic, catalytic, optoelectronic and magnetic properties of the material. The alterations of the physical properties of a nanoparticle due to confinement of electrons are generally referred to as quantum confinement effects.

Nanoparticles may exhibit a number of unique electronic, magnetic, catalytic, physical, optoelectronic and optical properties due to quantum confinement effects. For example, many nanoparticles exhibit photoluminescence effects that are significantly greater than the photoluminescence effects of macroscopic materials having the same composition. Additionally, these quantum confinement effects may vary as the size of the nanoparticle is varied.

The photoluminescence spectrum for each nanoparticle in a collection of nanoparticles having a polydisperse size distribution will be size dependent. Therefore, a collection of nanoparticles may be designed to include nanoparticles that emit light of different colors across the visible spectrum. By mixing the light emitted from the individual luminescent particles, and optionally, an unabsorbed portion of any primary photopumping light, a phosphor material able to provide white light having a higher CRI than conventional phosphor materials may be provided. By selecting nanoparticles having substantially monodisperse size distributions or by combining nanoparticles having selected, well-defined sizes, the phosphors may be designed to provide substantially monochromatic light, or polychromatic light with a selected color blend. The nanoparticles desirably emit with substantially size-independent quantum yields and lifetimes. Thus, the nanoparticles avoid the problems associated with differential aging which plague other phosphor materials. It should be noted that in some embodiments it may be possible for the diameters of the nanoparticles, and thus their emission characteristics, to change over time. Phosphors made from nanoparticles that experience such a shift are still contemplated as falling within the scope of this invention.

As one of skill in the art will recognize, the optimum size distribution of the nanoparticles will depend on a variety of factors, including the wavelength of the primary light used to excite the nanoparticles, the composition of the nanoparticles, and the desired color and quality of the emitted light. Thus, in some embodiments, a suitable size distribution is any distribution that permits the phosphor material to emit white light having a high CRI when the material is excited by the primary light source. In alternative embodiments, a suitable size distribution is any distribution that permits the phosphor material to emit a secondary light which, when mixed with an unabsorbed portion of the primary light, produces a white light having a high CRI.

The semiconductor nanoparticles may be provided in an ordered size-distribution that generates tunable white light. For example, the nanoparticles can be deliberately ordered to achieve any level of CRI or color temperature, where the latter refers to the amount of blue tint or red for a particular application. In general, as the color temperature increases, the light appears more blue and as the color temperature decreases, the light appears more red.

A variety of semiconductor materials may be used to produce the photoluminescent nanoparticles. These include, but are not limited to, Group IV nanoparticles, and nanoparticles made from alloys of group IV semiconductors, Group II-VI nanoparticles, and Group III-V nanoparticles.

Figure 2:
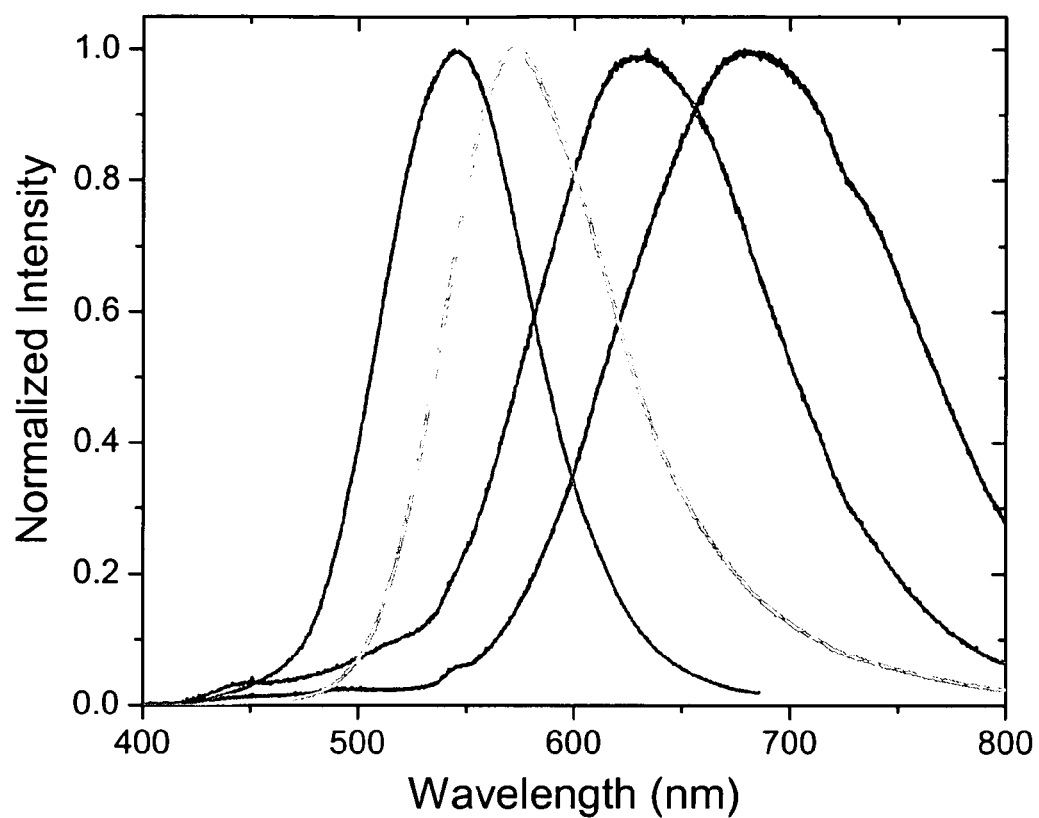
FIG. 2 shows the photoluminescence spectrum for four different samples of Si nanoparticles at an excitation wavelength of 365 mm.

Group IV semiconductor nanoparticles, including silicon nanoparticles, germanium nanoparticles, and SiGe alloy nanoparticles, Si or Ge cores comprising another inorganic coating, or nanoparticles doped with impurities are particularly well suited for use in the phosphor materials described herein. Group IV semiconductor nanoparticles offer several advantages over other semiconductor nanoparticles. First, the Group IV semiconductor nanoparticles, such as Si and Ge, are non-toxic. This makes phosphor materials made from these semiconductors attractive for commercial production. In contrast, Group II-VI semiconductors, such as CdS or CdSe, and Group III-V semiconductors, such as InAs and GaAs, are toxic materials which are strictly regulated, making these nanoparticles less desirable for use in commercial devices. Additionally, the ionic nature of the bonding in compound semiconductors, such as Group II-VI semiconductors, renders these materials much less chemically stable than Group IV semiconductors. Thus, phosphor materials made from Group IV nanoparticles will have longer lifetimes than similar materials made from compound semiconductors. Silicon also has a lower electron affinity than Group II-VI systems. Therefore, silicon has a lower barrier to hole injection, which increases the chances of electron-hole recombination. Finally, the emission characteristics of Group IV semiconductors makes these materials ideally suited for use as white light phosphors. Relative to other semiconductor materials, Group IV semiconductors photoluminesce with a rather wide spectrum. This is illustrated in FIG. 2 which shows the photoluminescence spectra for four different samples of silicon nanoparticles at an excitation wavelength of 365 nm. As shown in the figure, the silicon nanoparticles provide fairly broad and overlapping emission profiles. This is advantageous for white light phosphors because it enables a collection of Group IV nanoparticles having a polydisperse size distribution to emit a relatively smooth distribution of light across the visible spectrum using a single photoexcitation source, making them attractive candidates for broadband lighting.

As noted above, the Group IV nanoparticles may be core/shell nanoparticles having a Si or Ge core coated with an inorganic shell. In some such embodiments, the inorganic shell is composed of a wider bandgap semiconductor, such as ZnS or CdS. In other embodiments the core (e.g. Si) is coated with a smaller bandgap semiconductor (e.g. Ge). Alternatively, the nanoparticles may be composed of a Si core and a $Si_3N_4$ shell. Such core/shell nanoparticles may be made by adapting processes that have been used to produce larger core/shell particles or those used to produce core/shell nanoparticles for other material systems. Specific examples of such are formation of silicon/silicon nitride core/shell nanoparticles produced in a gas-phase pyrolysis method (see R. A. Bauer, J. G. M. Becht, F. E. Kruis, B. Scarlett, and J. Schoonman, *J. Am. Ceram. Soc.*, 74(11), pp. 2759-2768 (November 1991), the entire disclosure of which is incorporated herein by reference) and wet-chemical formation of cadmium selenide/zinc sulfide core/shell nanoparticles (see B. O. Dabbousi, J. Rodriguez-Viejo, F. V. Mikulec, J. R. Heine, H. Mattoussi, R. Ober, K. F. Jensen, and M. G. Bawendi, *J. Phys. Chem. B*, 101(46), pp. 9463-9475, (1997), the entire disclosure of which is incorporated herein by reference.

As discussed above, the specific emission spectrum of each nanoparticle in a collection of photoluminescent semiconductor nanoparticles is dependent upon the size of the nanoparticle. For example, Si nanoparticles having a diameter of about 1.5 nm to about 2 nm emit blue light, Si nanoparticles having a diameter of about 2 to about 3 nm emit green light, and Si nanoparticles having a diameter of about 4 to about 6 nm emit red light. In one embodiment the phosphor material contains a collection of nanoparticles having one or more emission peaks in the blue (i.e. ~400 to 500 nm), green (i.e. ~500 to 600 nm), and red (i.e. ~600 to 700 nm) regions of the visible spectrum when exited with a UV LED. The light from such peaks mixes to provide a phosphor material with a broad emission profile that emits across the visible spectrum. This design provides granular control of the color tuning which is superior to illumination devices based on the emission of three, relatively narrow red, green, and blue peaks. However, the devices may also contain nanoparticles that provide emission peaks in 4, 5 or even more colors. In a typical phosphor material comprising Group IV semiconducting nanoparticles, the nanoparticles will be composed of particles having diameters ranging from about 1 to about 100 angstroms. In other embodiments the collection of nanoparticles will be composed of particles having diameters ranging from about 10 to about 80 angstroms. This includes embodiments where the collection of nanoparticles is composed of particles having diameters ranging from about 5 to about 40 angstroms.

The photoluminescent nanoparticles may desirably be surface treated with organic or inorganic passivating agents that prevent reactive degradation of the nanoparticles when exposed to water and oxygen or other chemical contaminants. Particularly suitable organic passivating agents, or "capping agents", are described in U.S. Patent Application No. 2003/0003300; Nano Letters, 2, 681-685 (2002); and J. Am. Chem. Soc., 123, 3743-3748 (2001), which are incorporated herein by reference. Other suitable passivating agents and their production are described in J. M. Buriak, Chemical Reviews, 102(5), pp. 1271-1308 (2002). Organic passivating agents include, but are not limited to, alcohols, alkenes, alkynes, thiols, ethers, thioethers, phosphines, amines, amides, carboxylates, sulfonates, or quaternary ammonium compounds. Nanoparticles passivated with monolayers of these passivating agents are able to emit with relatively short (e.g. nanosecond scale or even sub-picosecond scale) lifetimes and high quantum yields.

The phosphor materials in accordance with the present invention may be composed of semiconductor nanoparticles coated on or embedded in materials acting as a support or binder for the nanoparticles. The support or binder material may have a lower refractive index than that of the nanoparticles. The support or binder material may also be transparent to the exciting radiation. In one embodiment the nanoparticles are supported in a flexible polymer matrix, which too may emit. Non-limiting examples of suitable support or binder materials include any of various polymers such as polyvinylidene fluoride, polyethylene oxide, polyethylene, polypropylene, polytetrafluoroethylene, polyacrylates and mixtures and copolymers thereof. Other suitable polymer binders include, but are not limited to, polystyrenes, polyimides, epoxies, acrylic polymers, polyurethanes and polycarbonates. Still other suitable binders are nitrocellulose, cyanoethyl cellulose and cyanoethyl pullulan. Alternatively, the nanoparticles may be coated with or embedded in an inorganic binder, such as silica glasses, silica gels or silicone polymers.

The nanoparticles may be dispersed in a polymeric binder by mixing the nanoparticles, the binder and optionally an appropriate solvent and/or dispersants. Suitable solvents include high vapor pressure organic solvents, such as hexane, cyclohexane, toluene or xylene, which may be easily removed once the dispersion have been formed into a coating, film or layer. The mixture may then be dried, hardened, cured or otherwise solidified to provide a dispersion of nanoparticles in a solid host matrix of binder. In some embodiments, the binder takes the form of polymerizable monomers or oligomers that are polymerized after mixing with the nanoparticles. An exemplary method for dispersing nanoparticles in a epoxy binder is described in U.S. Pat. No. 6,501,091, the entire disclosure of which is incorporated herein by reference.

In some embodiments, all of the nanoparticles that make up the phosphor material may be embedded in a polymer matrix. In other embodiments, nanoparticles that emit a single color (i.e. a group of nanoparticles having a substantially monodisperse size distribution) may be deposited in a plurality of domains on top of, or within, an organic film. For example, domains of red-emitting nanoparticles, domains of blue-emitting nanoparticles, and domains of green emitting nanoparticles may be deposited atop an organic film. The deposition of the domains may be carried out by conventional screen printing or inkjet printing techniques. For example, monodisperse suspensions of nanoparticles representing different colors could be placed in the different printing heads of an ink jet printer and printed directly to an organic film. Ink jet printing can provide better control and higher throughput. A suitable method and apparatus for ink jet printing phosphor materials in luminescent devices may be found in European patent application publication no. EP 1 111 966 A2, to General Electric, the entire disclosure of which is incorporated herein by reference. Screen printing can be used with higher viscosity solutions. For example, screen printing of OLEDs is described in U.S. patent publication 2002/0167024, published Nov. 14, 2002, to Jabbour et al. Formation of thin film layers can be carried out by methods described in, for example, Marc J. Madou, *Fundamentals of Microfabrication, The Science of Miniaturization, $2^{nd}$ Ed.,* 2002, Chapter 3. For example, silk-screening or screen printing is described on pages 154-156 with use of inks and pastes. In some embodiments, the organic film onto which the domains are printed may also have a mono or polydisperse distribution of nanoparticles embedded within it. The domains may typically have dimensions of no more than about 100 microns. This includes embodiments wherein the domains have dimensions of no more than about 50 microns, and further includes embodiments where the domains have dimensions of no more than about 10 microns. The suspensions used to print the domains may typically have a nanoparticle concentration sufficient to lay down no more than approximately a monolayer of the nanoparticles.

Two general approaches may be used to produce nanoparticles having an appropriate size distribution. In the first approach, the reaction conditions are carefully controlled during the production of the nanoparticles such that nanoparticles having a broad size distribution are produced in a single synthesis. Alternatively, batches of particles of a given size are produced separately and particles of the appropriate size are then selected and mixed together in the desired amounts.

Method for producing semiconductor nanoparticles, including Group IV nanoparticles are known. These methods include, solution, gas, plasma and supercritical fluid based approaches. United States PATENT APPLICATION No. US 2003/0003300 and J. Am. Chem. Soc., vol. 123, pp. 3743-3748 (2001) describe supercritical fluid-based approaches for making various semiconductor nanoparticles of a selected size. The entire disclosures of both of these references are incorporated herein by reference. Other suitable methods for producing Group IV nanoparticles (quantum dots) are presented in U.S. Pat. No. 6,268,041, in U.S. Patent Application Publication No. 2003/0066998, and in Huisken, et al., Adv. Mater., 14 (24), p. 1861 (2002), the entire disclosures of which are incorporated herein by reference. A plasma based synthesis for producing Si and Ge nanoparticles of controlled size in a continuous flow reactor if described in Gorla, et al., J. Vac. Sci. Technol. A., 15(3), pp. 860-864 (1997), the entire disclosure of which is incorporated herein by reference.

Alternatively, the nanoparticles may be produced in situ, as by conventional epitaxial growth processes. For example, a core-shell structure may be produced by first growing nanocrystals of a first semiconductor material, such as germanium, on a substrate, such as a silicon substrate, using well known lithographic techniques and subsequently growing an epitaxial layer of a second semiconductor material, such as silicon around the nanocrystals. Techniques for the epitaxial growth of various semiconductor materials, including chemical vapor deposition (CVD) are well-known in the art. Silicon nanoparticles may also be formed using a deconstructive approach, such as by etching from a bulk silicon wafer, followed by ultrasonic exposure and separation of the nanoparticles by different sizes. Suitable etch-based methods from producing nanoparticles may be found in *Properties of Porous Silicon*, Leigh Canham Ed.; INSPEC (1997), ISBN 0852969325, pp. 3-29; Heinrich, et al., Science, 255, pp. 66-68 (1992); Belomoin, et al., Appl. Phys. Lett., 77(6), p. 779-781 (2000); and Belomoin, et al., Appl. Phys. Lett., 80(5), p. 841-843 (2002), the entire disclosures of which are incorporated herein by reference.

Using one or more the above-referenced methods, nanoparticle size control can be obtained by controlling the synthesis conditions, such as reaction temperature, pressure, precursor concentration, flowrate, dilutant type, dilutant concentration, reagent type and reagent concentration. Because the particle size distribution can be controlled, the nanoparticles provide a single material solution for color tuning in the visible spectrum. Other noteworthy attributes of the particles include temperature and humidity independent emissions, high quantum efficiencies, fast radiative rates, and, in the case of Si nanoparticles, a 1:1 lattice match with bulk silicon. With proper passivation, the nanoparticles can be stored on a shelf for years without degradation. The different size (color) particles also may not suffer from differential aging, allowing the devices to maintain constant color quality over time.

In an illumination device made from the phosphor materials provided herein, a primary light source provides light capable of exciting the phosphor material and inducing the emission of a secondary light. The primary light source may be any light source capable of exciting the phosphor material and inducing the phosphor material to photoluminesce. Typically, the photoluminescence will have a lower energy than the photopumping light. For example, the photopumping light may be ultraviolet (UV) radiation or blue light which is used to produce photoluminescence of lower energies in the visible spectrum. Suitable primary light sources include blue LEDs and UV LEDs. In some instances the primary light source will include light having wavelengths from about 250 to about 500 nm. This includes primary light sources that emit light having wavelengths from about 320 nm to about 480 nm, also includes primary light sources that emit light having wavelengths from about 350 to about 450 nm and further includes primary light sources that emit light having wavelengths from about 380 to about 420 nm. Ultimately, the choice of primary light source will depend on the emission characteristics of the phosphor material.

Electroluminescent devices may also be employed as a primary light source. In their simplest form, these devices include an emissive layer sandwiched between an anode and a cathode. The emissive layer spontaneously emits light when placed in an electric field. Typically, the emissive layer includes ZnS particles, dispersed in a binder. These devices emit light in the blue and green regions of the visible spectrum. Other electroluminescent materials, including Group II-VI and Group III-V particles may also be used. Depending on the exact nature of the emissive layer, electroluminescent devices based on these materials may emit light at a variety of wavelengths including blue light, green light, blue-green light and UV light. Suitable electroluminescent devices for use as primary light sources in the illumination devices provided herein are known. These include the electroluminescent light emitting devices described in U.S. Pat. Nos. 6,406,803 and 5,537,000 and in U.S. Patent Application Publication Nos. 2002/0153830 and 2003/0042850, the entire disclosures of which are incorporated herein by reference. When an electroluminescent device is employed as a primary light source, it may be advantageous to use a device having a broad emissive area which dissipates heat better, increasing the longevity of illumination devices made therefrom.

Group IV semiconductor nanoparticles of the type described herein may also be used to form the emissive layer in an electroluminescent device. For example, an electroluminescent device may include a plurality Group IV semiconductor nanoparticles dispersed in a binder and coated onto a first conductive layer, such as an indium tin oxide (ITO) layer, with a second conductive layer, such as a evaporated aluminum layer, disposed over the nanoparticle dispersion. The first conductive layer optionally may be disposed on a transparent substrate, such as a glass or polyester substrate. The wavelength at which the electroluminescent device emits will depend on the voltage applied thereto and on the nature and size distribution of the nanoparticles contained therein. Electrical excitation generally requires a low turn-on voltage (e.g. about 1.5-15V), and has a fast response rate.

Figure 3:
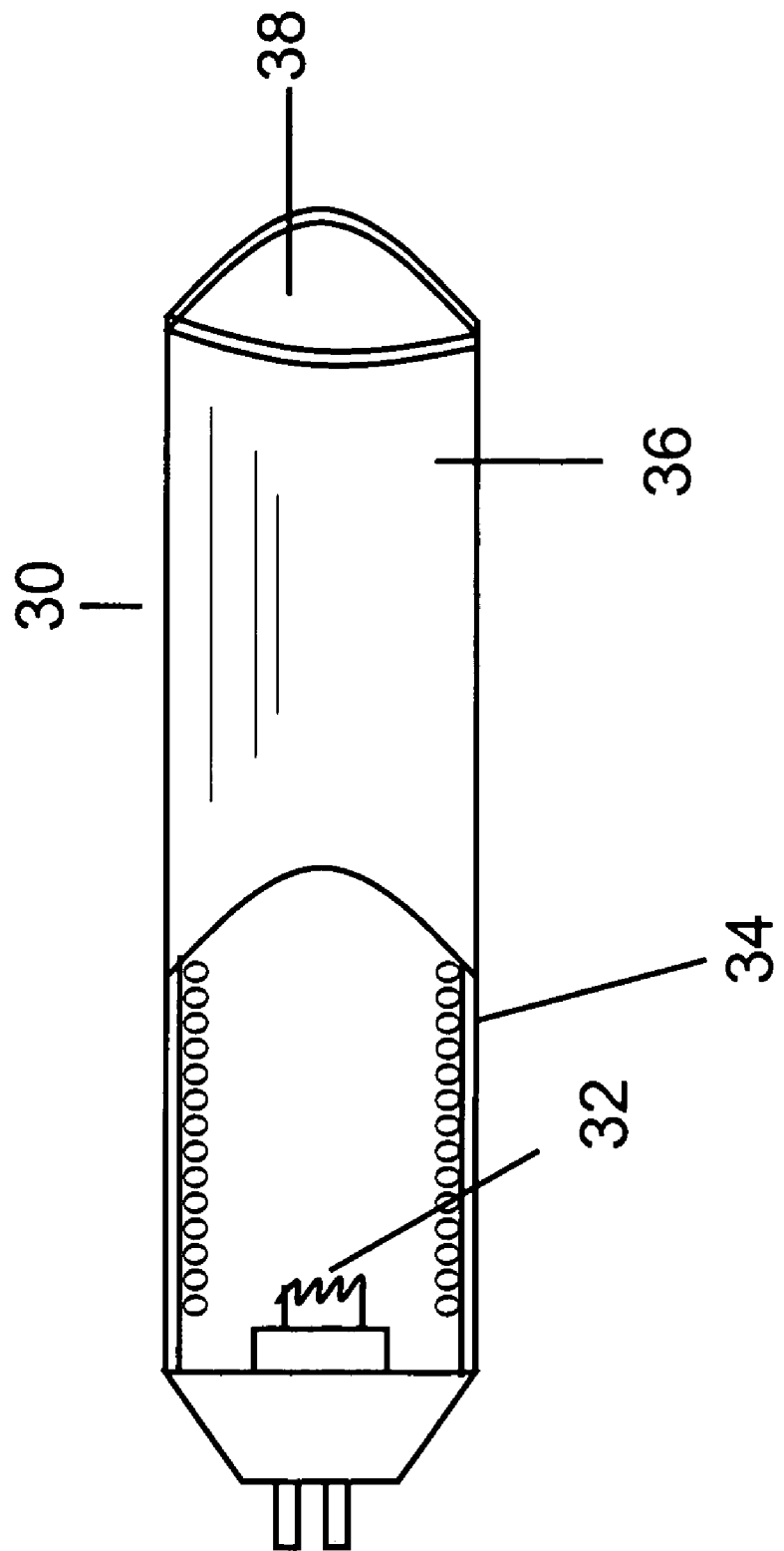
FIG. 3 shows a schematic diagram of a fluorescent tube having a coating of phosphor material on its internal surface.

Fluorescent lamps may also be used as primary light sources in the illumination devices provided herein. A fluorescent lamp, shown in FIG. 3, includes a bulb or tube 30, typically made of glass or quartz, filled with mercury and a rare gas to provide an electric discharge medium. Gas discharge electrodes 32 in the bulb or tube 30 provide means for providing electric power to the lamp. Lead lines conduct power to the electrodes. Phosphor materials 34 of the type described herein may be coated onto the interior 38 or exterior surface 36 of the bulb or tube. When a voltage is applied across the electrodes, the mercury emits UV radiation. Generally, the emitted UV radiation has wavelengths in the range of 240 to 260 nm, however in some devices may emit at wavelengths greater than 300 nm (e.g. 365 nm). The UV radiation serves as the primary light which is at least partially absorbed by the phosphor materials on the bulb or tube and remitted as a visible secondary light, desirably a high CRI white light. Fluorescent lamps onto which the phosphor materials may be coated include those described in U.S. Pat. Nos. 6,175,187 and 6,522,065, the entire disclosures of which are incorporated herein by reference.

In other embodiments the photoluminescence will have a higher energy than the photopumping light. In this embodiment a "reverse stokes shift" occurs when a nanoparticle absorbs two or more photons from a primary light source and the absorbed energy combines to produce fluorescent light having energy greater than the energy of either absorbed photon. Red LEDs are a specific example of a suitable primary light source for this embodiment. Red LEDs are typically based on AlInGaP material systems that have proven to be of much higher efficiency than GaN-based blue devices. Coupling red LEDs with nanoparticle phosphors (e.g. appropriately treated Group IV nanoparticles) capable of producing a reverse stokes shift to generate white light may yield a higher efficiency white solid-state light source.

Figure 4:
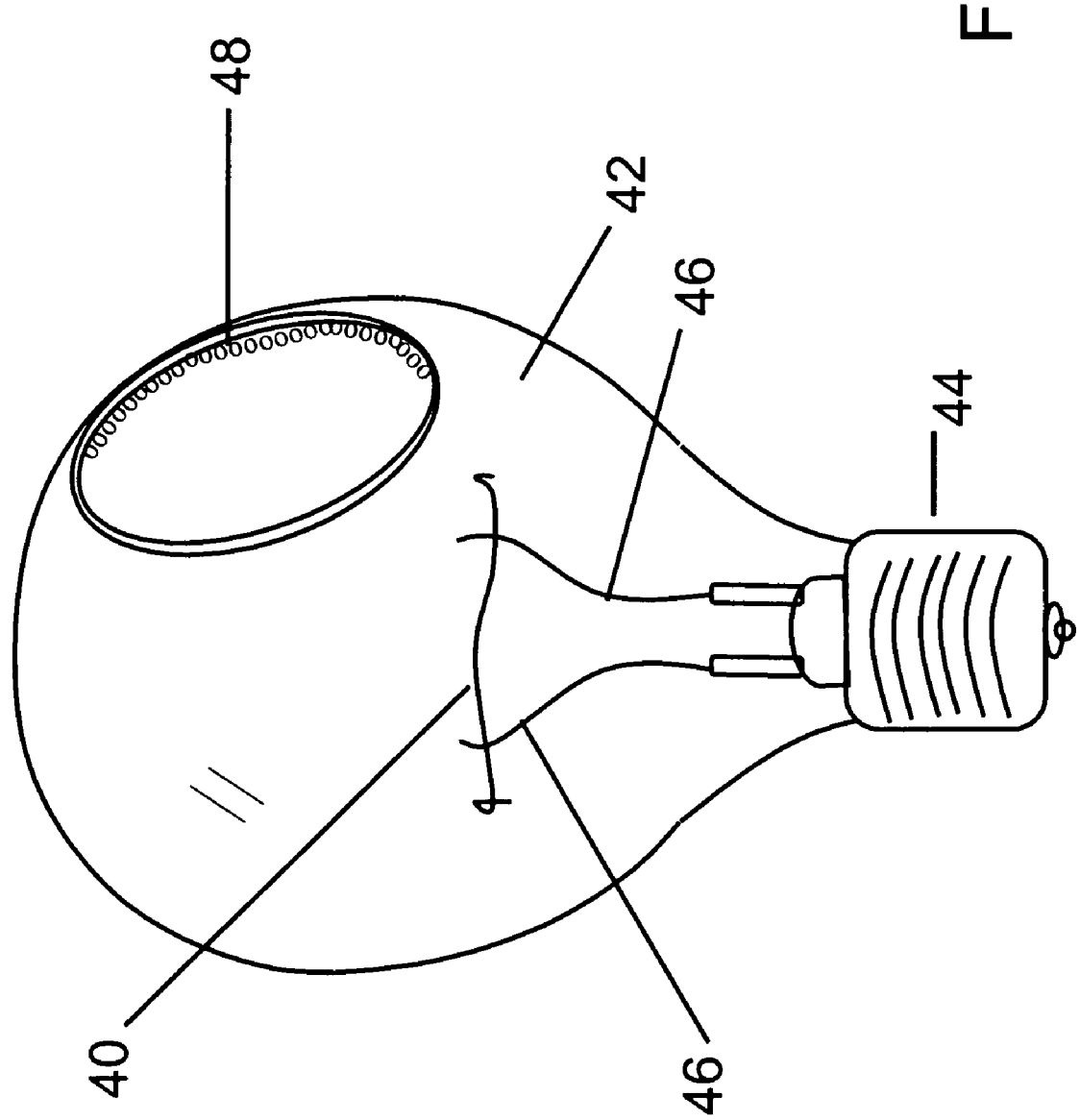
FIG. 4 shows a schematic diagram of a halogen bulb having a coating of phosphor material on its interior surface.

The phosphor materials provided herein may be used to absorb infrared (IR) radiation from incandescent or halogen lamps, converting it into visible light, such as white light and thereby increasing the CRI of the lamp output. Both halogen and incandescent lamps emit visible and IR light. Some such lamps include bulbs having a coating on their interior or exterior surface which absorbs or reflects the IR portion of the light to increase the CRI. The present devices represents an improvement on such designs by converting the IR light into visible, desirably white light, and improving the efficacy of conventional lighting systems. In one exemplary embodiment Group IV nanoparticles embedded in an organic or inorganic binder are applied to at least a portion of the exterior or interior surface of an incandescent or halogen light bulb. Typically, a halogen lamp (FIG. 4) for use in the lighting devices provided herein include a tungsten filament 40 encased in a quartz envelope or bulb 42 having a sealing section 44 and filled with a halogen gas. An internal lead line 46, extending through the sealing section, is connected to each end of the filament. As shown in partial cross-section in FIG. 4, a phosphor material 48 may be coated on at least a portion of the interior of the bulb 42. The internal lead lines are each connected to a metal foil (not shown) in the sealing section. External lead lines (not shown) extend outwardly from the metal foils to provide a source of electricity. Halogen lamps that may be used as the primary light source are described in U.S. Pat. Nos. 4,965,485; 6,336,837; and 6,508,573, the entire disclosures of which are incorporated herein by reference.

Illumination devices made from the phosphor materials may have a variety of designs, provided the phosphor is positioned to absorb at least a portion of the light emitted by the primary light source. The illumination devices may desirably be operated at operating temperatures that are low enough to substantially maintain the stability of the phosphor materials. These temperatures will likely be most dependent on the nature of the materials used as a primary light source. For phosphor materials composed of Group IV semiconductor nanoparticles, the operating temperatures will generally be no more than about 250° C., but for some applications it may be desirable to use lower operating temperatures (e.g. no more than about 150° C.). When higher operating temperatures are desirable or unavoidable, it may be advantageous to use semiconductor nanoparticles having an inorganic shell which are stable under high operating temperatures. Groups IV nanoparticles with an inorganic shell, are particularly well-suited for such uses.

The phosphor material may be coated as a film on a light emitting surface of the primary light source, such an LED or an electroluminescent device, or onto the interior or exterior surface of an incandescent, halogen or fluorescent bulb. For example, a solution containing the nanoparticles, a binder and, optionally, a solvent may be coated onto a surface of a primary light source and subsequently dried, hardened, cured or otherwise solidified. Suitable solvents include high vapor pressure organic solvents, such as cyclohexane, toluene or xylene, which may be easily removed once the solution has been formed into a coating, film or layer. The coating may take place using conventional means such as spray coating, spin casting, screen printing, dip coating, roller coating or ink jet printing. If the primary light source is an LED or an electroluminescent device contained within a cup, such as a reflector cup, the nanoparticle-containing solution may be poured over the light source and subsequently solidified to encase the primary light source, e.g. by polymerizing binder monomers in the solution. Alternatively, the phosphor material may comprise phosphor particles dispersed in a layer of support material disposed around a surface of a primary light source. In this embodiment, the layer is pre-solidified and adhered to the surface of the primary light source using an appropriate adhesive, such as an epoxy adhesive or by heating the layer on the surface of the light source to a temperature sufficient to attach the layer to the surface.

The thickness of the phosphor material coating or layer is not particularly limited but can be, for example, about 4 nm to about 1 mm, more particularly, about 50 nm to about 100 microns, and more particularly, about 100 nm to about 50 microns. The phosphor material coating or layer can be sufficiently thin to be a monolayer of nanoparticles, wherein the thickness of the material is approximately the diameter of the nanoparticle. In general, the material can be a continuous layer although non-continuous layers having separated regions of light-emitting nanostructures can be used as desired.

In another design, an electroluminescent primary light source and a photoluminescent secondary light source may be merged into a single hybrid device layer. In this design electroluminescent particles and photoluminescent nanoparticles, of the type described herein, are both contained within a single emissive layer sandwiched between an anode and a cathode. Typically, the particles will be contained in a conductive binder, such as a conductive polymeric binder. The binder may itself be an electroluminescent material. In response to an applied electric field, the electroluminescent particles emit a spectrum of electromagnetic radiation. The electroluminescent particles are desirably selected such that they electroluminesce in the range of UV to blue light. The photoluminescent nanoparticles absorb at least a portion of this radiation and emit a secondary light. As described above, the size distribution of the photoluminescent nanoparticles may be preselected to provide a white light having a high CRI.

Figure 5:
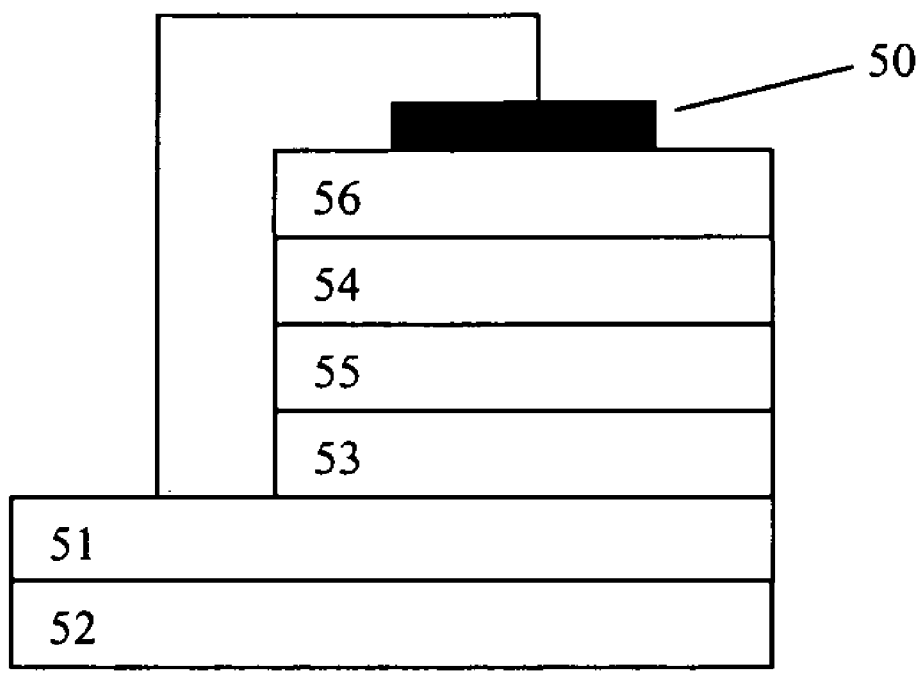
FIG. 5 shows a schematic diagram of an exemplary organic LED device made with a phosphor material in accordance with the present invention.

In another embodiment the illumination device may have an organic light emitting diode (OLED) type structure, as shown in FIG. 5. In an OLED organic films are sandwiched between two charged electrodes, one a metallic cathode 50 and one a transparent anode 51, such as ITO, optionally disposed atop a transparent substrate 52, such as glass. The organic films consist of a hole-transport layer 53, an electroluminescent emissive layer 54, a photoluminescent emissive layer 55, and an electron-transport layer 56. Alternatively, layer 55 may be positioned between layers 53 and 51, may be positioned between layers 51 and 54, or may be combined with or embedded in layer 52. Both the electron transport layer and the hole transport layer may be made of a doped polymeric material, such as poly(phenylene vinylene). Other layers that may optionally be incorporated into the OLED structure include, a hole injection layer, an electron injection layer and a hole blocking layer. When voltage is applied to the OLED, the injected positive and negative charges recombine in the electroluminescent emissive layer to create a primary light source. Light from this primary light source then acts to photopump the photoluminescent emissive layer. In this configuration, the phosphor particles of the type described herein may be embedded in the photoluminescent emissive layer and the electroluminescent emissive layer may be made of any suitable electroluminescent light emitting organic material. In a variation of this embodiment, the electroluminescent emissive layer may have blue or UV light emitting electroluminescent nanoparticles, e.g. Group IV nanoparticles of the type described herein, dispersed or embedded therein. When an OLED is employed as a primary light source, it may be advantageous to use a device having a broad emissive area which dissipates heat better, increasing the longevity of illumination devices made therefrom.

Figure 6:
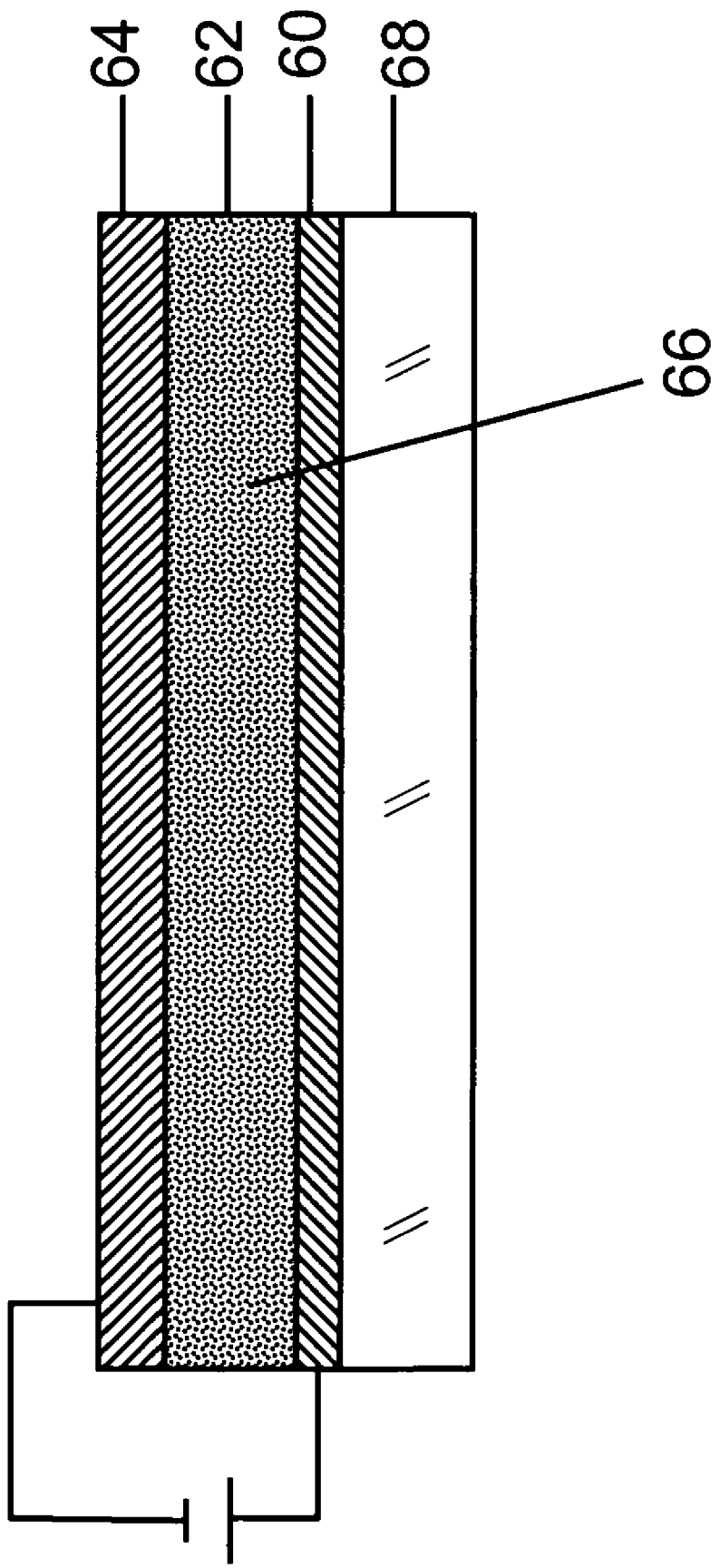
FIG. 6 shows an organic LED device having a single organic layer with phosphor nanoparticles dispersed therein.

Alternatively, the transport layers and the electroluminescent and photoluminescent emissive layers could be combined into a single organic layer made from an electroluminescent polymer having a plurality of phosphor particles dispersed therein. In this configuration, shown in FIG. 6, an anode layer 60 injects positive charge carriers into the organic layer 62 and the cathode layer 64 injects negative charge carriers into the organic layer 62 when a voltage is applied across the OLED. The positive and negative charges then recombine in the organic layer to provide a primary light. Some or all of this primary light is absorbed by the phosphor particles 66 dispersed in the organic layer. These particles then emit a secondary light. As shown in the figure, the anode layer is optionally disposed atop a transparent substrate 68.

Materials for making the various layers in an OLED device are known. For example, the anode may be made of ITO, tin oxide, indium oxide, zinc oxide, indium zinc oxide, aluminum oxide, gold, silver, or composite coatings, such as metal nanocrystal coatings or carbon nanotube doped polymers. Generally, the anode materials will be selected to provide the desired combination of electrical conductivity and optical transparency. Suitable cathode materials include, for example, K, Li, Na, Mg, La, Ce, Ca, Sr, Ba, Al, Ag, In, Sn, Zn, Zr, or mixtures thereof. Preferred materials for the manufacture of cathodes include Ag—Mg, Al—Li, In—Mg, and Al—Ca alloys. Tris(8-hydroxyquinolato) aluminum (Alq3) may be used as an electron-transporting material. 3-phenyl-4-(1f-naphthyl)-5-phenyl-1,2,4-triazole (TAZ) may be used as a hole blocking material. N,N'-bis(3-methylphenyl)-N,N'-diphenylbenzidine (TPD) may be used as a hole transport material. Poly-3,4-ethylenedioxythiophene (PEDOT) is a conductive polymer that may be used as a hole injection material. A more detailed description of suitable materials for the electroluminescent organic layer, the anode and the cathode is provided in U.S. Pat. No. 6,515,314, the entire disclosure of which is incorporated herein by reference.

The formation of the electroluminescent organic layer having phosphor nanoparticles dispersed therein may be carried out in a manner similar to that used to form a layer of phosphor nanoparticles dispersed in a polymer binder. Specifically, the organic layer may be made by mixing the nanoparticles with the organic electroluminescent material to provide a dispersion. Optionally, a solvent may be added to the dispersion is order to modify its viscosity and coating properties. The solvent is desirably a high vapor pressure organic solvent that may be easily removed from the organic layer after it has been formed. Examples of suitable solvents include, but are not limited to, cyclohexane, toluene and xylene. When a polymeric electroluminescent material is employed, the mixture may be composed of monomers or oligomers of the polymer mixed with the phosphor nanoparticles and polymerization of the oligomers or monomers may take place after a coating or film of the material has been formed.

Figure 7:
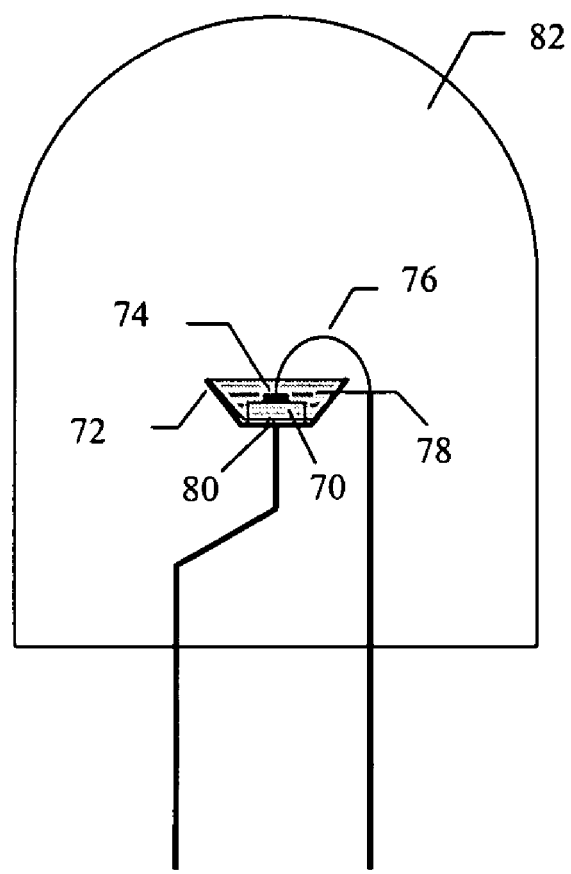
FIG. 7 shows a schematic illustration of one non-limiting example of an illumination device in accordance with the invention. The device includes an LED as a primary light source coated with a layer of phosphor material.

In addition to the primary light source and the phosphor material, the illumination devices may include numerous additional components. Such components are well known in the art and include, contacts, wire bonds, a lens, an outer dome, a reflector cup, a ground, an anti-reflective coating, epoxies, binders, and the like. FIG. 7 shows one exemplary embodiment of a typical white light LED in accordance with the present invention. In this embodiment, an LED primary light source 70 is located in a cup 72. An electrical contact 74 connected to a bond wire 76 is disposed on the LED and both the contact and the LED are coated with the phosphor material 78. A second contact 80 is disposed below the LED. A dome lens 82 encapsulates the device. Other phosphor-based light source designs that include some or all of the above components and methods for constructing light sources from the components are described in U.S. Pat. Nos. 6,521,915; 6,417,019; 6,252,915; 6,069,440; and 5,813,753, the entire disclosures of which are incorporated herein by reference.

The present methods are further illustrated by the following non-limiting examples. By way of illustration a general method for producing Si nanoparticles is described below. However, it should be understood that other Group IV nanoparticle systems may also be produced, as described in United States Patent Application No. US 2003/0003300.

EXAMPLE 1

Production of a White Light Emitting Illumination Device Using a Silicon Nanoparticle-Based Phosphor Material This example provides one non-limiting example of a method that may be used to produce a white light illumination device from a blue LED and a silicon nanoparticle-based phosphor material.

Two phosphor/binder mixtures of silicon nanoparticles with a paraffin wax binder. Hexane was used as a solvent to dissolve the wax and disperse the silicon nanoparticles within the wax binder. In the first mixture, silicon nanoparticles with yellow luminescent emission ($\lambda_{max}$=588 nm) were added to the paraffin/hexane binder solution. In the second mixture, silicon nanoparticles with red-orange luminescent emission ($\lambda_{max}$=640 nm) were added to a second paraffin/hexane binder solution. In both cases, the hexane solvent was partially removed via evacuation after mixing to form a paste. This paste was applied to an uncoated blue LED die (CREE Xbright InGaN on SiC die, obtained from Illumitech (Chicago, Ill.)) which had been previously mounted and wire-bonded. Addition of the paste to the die was actively monitored both by eye and using a spectrometer to achieve an optimal balance between transmission of blue light through the silicon nanoparticle/wax binder system and absorption by and re-emission of light by the silicon nanoparticles. Furthermore, the amount of each phosphor/binder mixture was controlled to achieve the desired balance of yellow and red-orange emission from the device. After application of the paste, the device was dried at room temperature in the air to solidify the wax binder. The completed devices emitted white light when the underlying blue LED was activated electrically.

EXAMPLE 2

Production of a White Light Emitting Illumination Device Using a Silicon Nanoparticle-Based Phosphor Material This example provides another non-limiting example of a method that may be used to produce a white light illumination device from a blue LED and a silicon nanoparticle-based phosphor material.

A phosphor/binder mixture of silicon nanoparticles in a UV-curable acrylate binder was prepared. Since the UV-curable acrylate is a liquid adhesive resin, no solvent was needed. For this device, two types of silicon nanoparticles were produced. The first phosphor consisted of silicon nanoparticles with red luminescent emission ($\lambda_{max}$=700 nm). These nanoparticles were combined with NOA 88 UV-curable acrylate adhesive (Norland Products, Inc.) in a ratio of approximately 1:10 nanoparticles:acrylate. The second phosphor consisted of silicon nanoparticles with green luminescent emission ($\lambda_{max}$=555 nm). These nanoparticles were combined with a second portion of NOA 88 UV-curable acrylate adhesive in a similar ratio. The silicon nanoparticle/acrylate mixtures were viscous fluids. These fluids were applied to the LED die (CREE Xbright InGaN on SiC die, obtained from Illumitech (Chicago, Ill.)) by careful liquid drop dispensing. After dispensing, the device was exposed to UV light to partially cure the acrylate binder. Careful addition of silicon nanoparticle/acrylate to the die with monitoring of the emitted light was used to optimize the emission color. Using this process of adding a drop of liquid acrylate phosphor, monitoring, and partial curing; careful control of the color of the output was achieved. Afterwards, the device was fully cured by extended exposure of the device to UV light per the manufacturer's recommendations. When driven electrically, the completed devices emitted white light.

While the principles of this invention have been described in connection with specific embodiments, it should be understood clearly that these descriptions are made only by a way of example and are not intended to limit the scope of the invention.

What is claimed is:

1. A light emitting device comprising:
   (a) a primary light source which emits primary light; and
   (b) a phosphor material comprising a plurality of nanoparticles, the nanoparticles comprising a Group IV semiconductor, which absorbs at least a portion of the primary light and emits a secondary light, wherein the secondary light or the combination of the secondary light with the primary light comprises a white light.

2. The light emitting device of claim 1, wherein the primary light is ultraviolet or blue light.

3. The light emitting device of claim 2, wherein the primary light source is a fluorescent lamp.

4. The light emitting device of claim 1, wherein the primary light comprises wavelengths of from 320 nm to 480 nm and the secondary light has a lower energy than the primary light.

5. The light emitting device of claim 4, wherein the primary light source is a blue light emitting diode or an ultraviolet light emitting diode.

6. The light emitting device of claim 1, wherein the primary light source is an infrared light source and the secondary light has a higher energy than the infrared light.

7. The light emitting device of claim 6, wherein the primary light source is a red light emitting diode.

8. The light emitting device of claim 6, wherein the primary light is a halogen lamp or an incandescent lamp.

9. The light emitting device of claim 1, wherein the nanoparticles have an average particle diameter of from about 1 to about 150 angstroms.

10. The light emitting device of claim 1, wherein the phosphor material has an emission profile comprising emission peaks in the green to red regions of the visible spectrum.

11. The light emitting device of claim 1, wherein the phosphor material has an emission profile comprising emission peaks in the blue to red regions of the visible spectrum.

12. The light emitting device of claim 1, wherein the Group IV semiconductor is silicon.

13. The light emitting device of claim 1, wherein the Group IV semiconductor is germanium.

14. The light emitting device of claim 1, wherein the nanoparticles comprises core/shell nanoparticles comprising a Group IV semiconductor core and an inorganic shell.

15. The light emitting device of claim 14, wherein the inorganic shell comprises ZnS or CdS.

16. The light emitting device of claim 14, wherein the core comprises silicon and the shell comprises $Si_3N_4$ or SiC.

17. The light emitting device of claim 14, wherein the core comprises silicon and the shell comprises Ge.

18. The light emitting device of claim 14, wherein the core comprises germanium and the shell comprises Si.

19. The light emitting device of claim 1, wherein the nanoparticles are dispersed in a binder.

20. The light emitting device of claim 1, wherein the primary light source comprises an electroluminescent device.

21. The light emitting device of claim 1, wherein the primary light source comprises an organic light emitting material.

22. The light emitting device of claim 1, wherein the nanoparticles are dispersed in the organic light emitting material.

23. The light emitting device of claim 1, wherein the Group IV semiconductor is doped with impurities.

24. The light emitting device of claim 1, wherein the nanoparticles are embedded in an inorganic binder.

25. The light emitting device of claim 1, wherein nanoparticles comprising a Group IV semiconductor are SiGe alloy nanoparticles.

26. The light emitting device of claim 1, wherein the white light has a color rendering index of at least 90.

27. The light emitting device of claim 1, wherein the device produces white light with an efficiency of at least 30 lm/w.

28. A phosphor material comprising a plurality of domains deposited on an organic film, each domain comprising a plurality of luminescent semiconductor nanoparticles having a substantially monodisperse size distribution.

29. The phosphor material of claim 28, wherein the organic film has a plurality of luminescent nanoparticles dispersed therein.

30. The phosphor material of claim 29, wherein the luminescent nanoparticles dispersed in the organic film have a substantially monodisperse size distribution.

31. The phosphor material of claim 29, wherein the luminescent nanoparticles dispersed in the organic film have a polydisperse size distribution.

32. The phosphor material of claim 28, wherein the domains have dimensions of no more than about 100 microns.

33. The phosphor material of claim 28, wherein the plurality of domains comprise a monolayer of nanoparticles.

* * * * *

UNITED STATES PATENT AND TRADEMARK OFFICE
CERTIFICATE OF CORRECTION

PATENT NO. : 7,279,832 B2  Page 1 of 1
APPLICATION NO. : 10/814295
DATED : October 9, 2007
INVENTOR(S) : Paul Thurk and David Jursberg It is certified that error appears in the above-identified patent and that said Letters Patent is hereby corrected as shown below:

Col. 3, line 53:

Delete "365 mm" and replace it with --365 nm--

Col. 16, Claim 22, line 33:

Delete "claim 1" and replace it with --claim 21--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,279,832 B2 | Page 1 of 1 |
| APPLICATION NO. | : 10/814295 | |
| DATED | : October 9, 2007 | |
| INVENTOR(S) | : Paul Thurk and David Jurbergs | |

It is certified that error appears in the above-identified patent and that said Letters Patent is hereby corrected as shown below:

On the Title Page:

Item [75]

Please correct the last name spelling of "David Jursberg" to read --David Jurbergs--.

Signed and Sealed this

Thirtieth Day of December, 2008

JON W. DUDAS
*Director of the United States Patent and Trademark Office*